(12) United States Patent
Aritome et al.

(10) Patent No.: US 9,058,878 B2
(45) Date of Patent: Jun. 16, 2015

(54) READ METHODS OF SEMICONDUCTOR MEMORY DEVICE

(75) Inventors: Seiichi Aritome, Gyeonggi-do (KR); Soon Ok Seo, Gwangju (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 362 days.

(21) Appl. No.: 13/341,303

(22) Filed: Dec. 30, 2011

(65) Prior Publication Data

US 2012/0170378 A1  Jul. 5, 2012

(30) Foreign Application Priority Data

Jan. 3, 2011 (KR) .................... 10-2011-0000113

(51) Int. Cl.
  *G11C 16/04* (2006.01)
  *G11C 11/56* (2006.01)
  *G11C 16/26* (2006.01)

(52) U.S. Cl.
  CPC ........ *G11C 16/0483* (2013.01); *G11C 11/5642* (2013.01); *G11C 16/26* (2013.01)

(58) Field of Classification Search
  CPC ...... G11C 29/82; G11C 29/76; G11C 29/798; G11C 16/04; G11C 16/0483; G11C 16/10; G11C 16/12; G11C 11/5628; G11C 11/5642
  USPC ............... 365/185.2, 185.09, 185.17, 185.19, 365/185.22
  See application file for complete search history.

(56) References Cited

U.S. PATENT DOCUMENTS 7,450,425 B2 *  11/2008  Aritome .................. 365/185.19

FOREIGN PATENT DOCUMENTS

| KR | 1020080080529 | 9/2008 |
| KR | 1020090020117 | 3/2009 |
| KR | 1020100028924 | 3/2010 |

OTHER PUBLICATIONS

Notice of Allowance issued from the Korean Intellectual Property Office on Nov. 27, 2012.

* cited by examiner

*Primary Examiner* — Thao H Bui
(74) *Attorney, Agent, or Firm* — IP & T Group LLP

(57) ABSTRACT

A read method of a semiconductor memory device includes performing a read operation on target cells by using a first read voltage, terminating the read operation on the target cells if, as a result of the read operation on the target cells, error correction is feasible, performing a read operation on first cells next to the target cells along a first direction if, as a result of the read operation on the target cells, error correction is unfeasible, performing the read operation again on the target cells by selecting one of a plurality of read voltages in response to a result of the read operation on the first cells and by using the selected read voltage for reading data of the target cells, and terminating the read operation on the target cells if error correction is feasible.

26 Claims, 8 Drawing Sheets

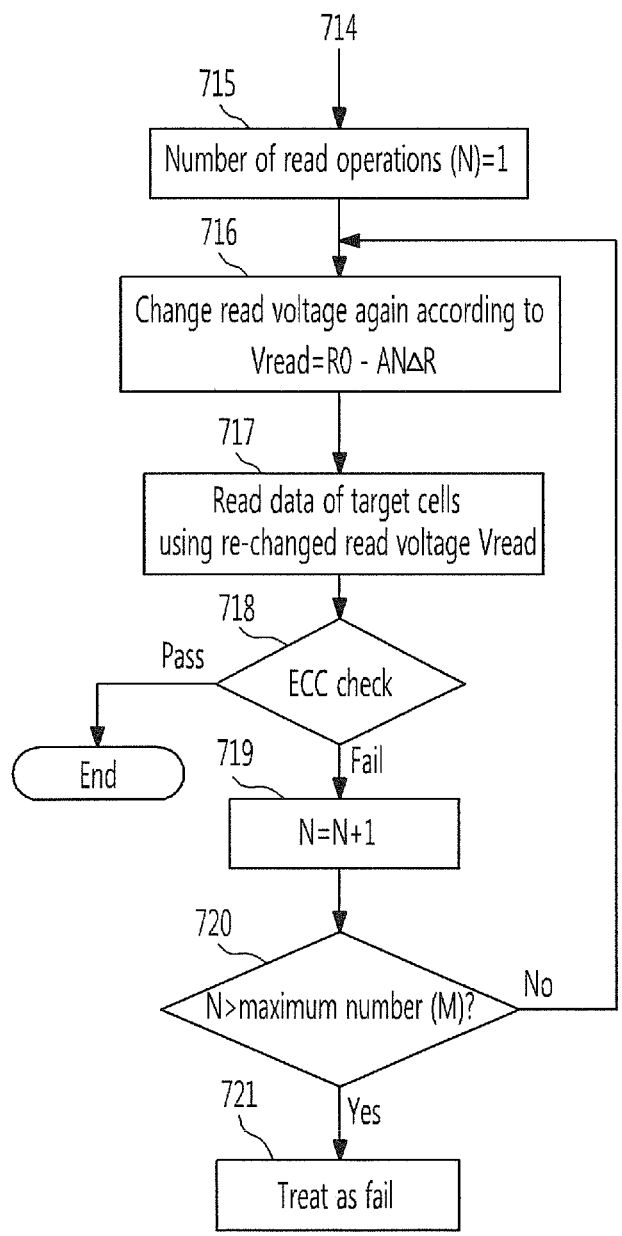

READ METHODS OF SEMICONDUCTOR MEMORY DEVICE

CROSS-REFERENCE TO RELATED APPLICATION

Priority to Korean patent application number 10-2011-0000113 filed on Jan. 3, 2011, the entire disclosure of which is incorporated by reference herein, is claimed.

BACKGROUND

Exemplary embodiments relate to read methods of a semiconductor memory device and, more particularly, to read methods of a non-volatile memory device.

FIG. 1 is a circuit diagram of a memory cell array for illustrating a conventional read method.

Referring to FIG. 1, a semiconductor memory device includes a memory cell array for storing data. The memory cell array includes a plurality of memory cell blocks. For illustration purposes, one of the plurality of memory cell blocks is shown in FIG. 1. The memory cell block is described in detail below.

The memory cell block includes a plurality of cell strings ST0 to STk. Each (for example, ST0) of the cell strings includes a drain select transistor DST coupled to a bit line BL0, a source select transistor SST coupled to a common source line CSL, and a plurality of memory cells C00 to C0$n$ coupled in series between the drain select transistor DST and the source select transistor SST.

In particular, an interval between the cell strings ST0 to STk of the memory cell block is inversely proportional to an increase in the degree of integration of the semiconductor memory devices. An interval between the memory cells belonging to the same cell string ST0 is also gradually decreased. Here, when additional cells are programmed after target cells are programmed in a program operation, the threshold voltages of previously programmed cells may be changed due to interference generated when the program operation of subsequently programmed cells is performed. A change in the threshold voltages of the memory cells is described in detail below.

FIG. 2 is a graph illustrating above-discussed features with respect to a read method.

Referring to FIGS. 1 and 2, if one of the cells belonging to a first cell string ST1 is a target cell to be read, the threshold voltage of the target cell 14 may be changed depending on the threshold voltages of cells 12 and 16 next to the target cell 14. The threshold voltage of the target cell 14 is changed by interference generated when the program operation of the next cells 12 and 16 is performed. Often, the threshold voltage R0 of the target cell 14 rises to, for example, R0+1. However, the threshold voltage R0 of the target cell 14 may drop to R0−1 depending on the program states of the next cells 12 and 16.

For example, if the next cells 12 and 16 are in an erase state and a third program state or the erase state and a second program state, respectively, or both the next cells 12 and 16 are in the second program state, the threshold voltage of the target cell 14 coupled between the next cells 12 and 16 may drop to R0−1. In this case, if data of the target cell 14 is read using a read voltage Vr, the data may not be accurately read because of cells 22 having respective threshold voltages each lower than the read voltage Vr.

BRIEF SUMMARY

According to exemplary embodiments, when the read operation of target cells is performed, the read voltage of the target cells is changed depending on a result of the read operation of cells next to the target cells and the read operation of the target cells is performed using the changed read voltage. Accordingly, reliability of the read operation can be improved.

A read method of a semiconductor memory device according to an aspect of the present disclosure includes performing a read operation on target cells by using a first read voltage, terminating the read operation on the target cells if, as a result of the read operation on the target cells, error correction is feasible, performing a read operation on first cells next to the target cells along a first direction if, as a result of the read operation on the target cells, error correction is unfeasible, performing the read operation again on the target cells by selecting one of a plurality of read voltages in response to a result of the read operation on the first cells and by using the selected read voltage for reading data of the target cells, and terminating the read operation on the target cells if error correction is feasible as a result of performing the read operation on the target cells using the selected voltage.

A read method of a semiconductor memory device according to another aspect of the present disclosure includes performing a read operation on target cells by using a first read voltage, performing a read operation on cells next to the target cells along a first direction if, as a result of the read operation on the target cells, error correction is unfeasible, performing a read operation on the target cells by using a selected one of a plurality of read voltages, counting a number of times that the read operation is performed on the target cells if, as a result of performing the read operation on the target cells using the selected read voltage, error correction is unfeasible, performing the read operation on the target cells by changing the selected read voltage in response to the count, and terminating the read operation of the target cells if, as a result of performing the read operation on the target cells using the selected read voltage, the error correction is feasible.

BRIEF DESCRIPTION OF THE DRAWINGS

FIGS. 7A and 7B are flowcharts illustrating a read method according to a fourth embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
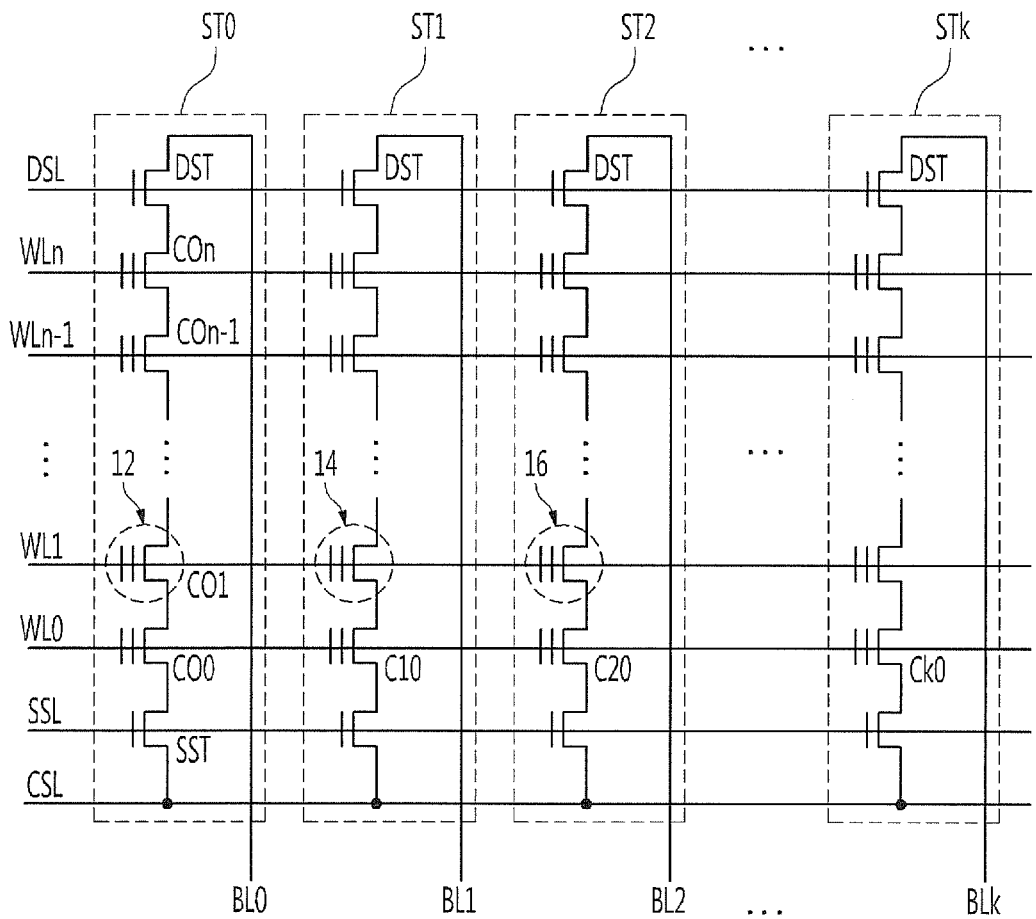
FIG. 1 is a circuit diagram of a memory cell array for illustrating a conventional read method.
Figure 2:
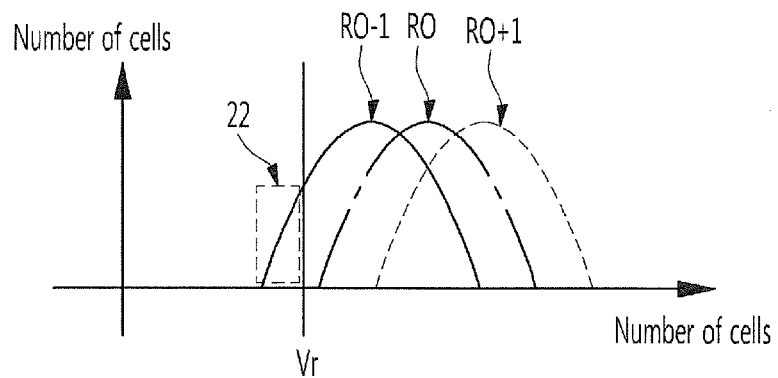
FIG. 2 is a graph illustrating features related to the read method.
Figure 3:
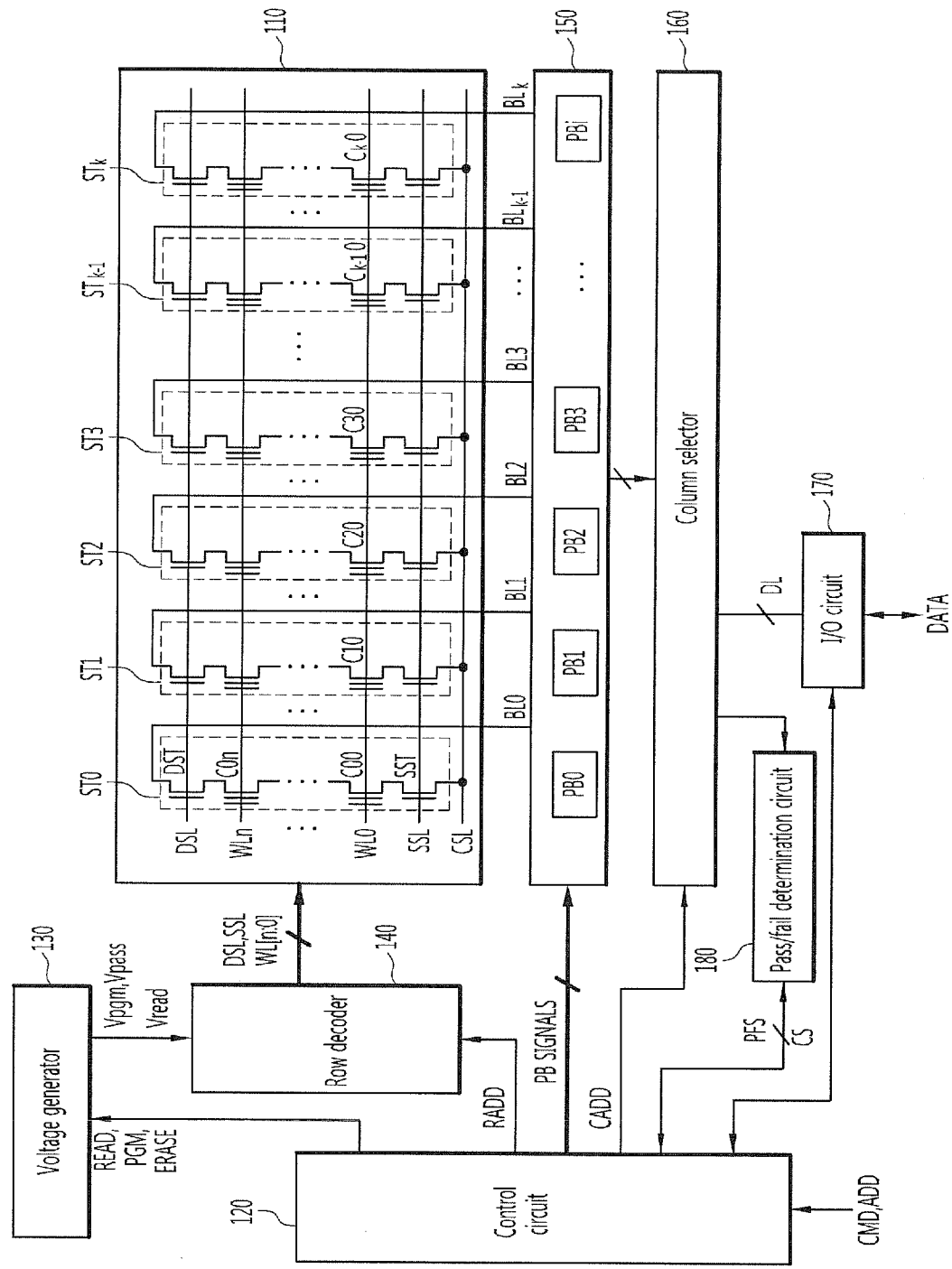
FIG. 3 is a block diagram of a semiconductor memory device for illustrating read methods according to this disclosure.

FIG. 3 is a block diagram of a semiconductor memory device for illustrating read methods according to this disclosure.

The semiconductor memory device includes a memory cell array 110, an operation circuit group (130, 140, 150, 160, 170, and 180) configured to perform a program operation or a read operation on the memory cells of the memory cell array 110, and a control circuit 120 configured to control the operation circuit group (130, 140, 150, 160, 170, and 180).

For example, in a NAND flash memory device, the operation circuit group includes a voltage generator 130, a row decoder 140, a page buffer group 150, a column selector 160, an I/O circuit 170, and a pass/fail determination circuit 180.

The memory cell array 110 includes a plurality of memory cell blocks. One of the memory cell blocks is shown in FIG. 3. The memory cell block includes a plurality of strings ST0 to STk. Each (for example, ST0) of the strings includes a source select transistor SST coupled to a common source line CSL, a plurality of memory cells C00 to C0n, and a drain select transistor DST coupled to a bit line BL0. The gate of the source select transistor SST is coupled to a source select line SSL, the gates of the memory cells C00 to C0n are coupled to respective word lines WL0 to WLn, and the gate of the drain select transistor DST is coupled to a drain select line DSL. The strings ST0 to STk are coupled to respective bit lines BL0 to BLk and are in common coupled to the common source line CSL. Furthermore, the memory cells coupled to the same word line are grouped and called a page. Accordingly, the number of pages equal to the number of word lines is formed in one memory cell block.

The control circuit 120 internally generates a program operation signal PGM, a read operation signal READ, or an erase operation signal ERASE in response to a command signal CMD and also generates control signals PB SIGNALS for controlling the page buffers of the page buffer group 150 depending on a type of an operation.

Furthermore, the control circuit 120 internally generates a row address signal RADD in response to an address signal ADD. The control circuit 120 determines whether program data has been inputted to the page buffer group 150 in response to a check signal CS generated by the pass/fail determination circuit 180 in a program operation. The control circuit 120 determines whether the threshold voltages of memory cells have risen to a target level in response to a pass/fail signal PFS, generated by the pass/fail determination circuit 180, after a program verify operation and determines whether to perform a program operation again or to finish the program operation according to a result of the determination.

The voltage supply circuit (130 and 140) supplies operating voltages for the program operation, the erase operation, or the read operation of memory cells to the drain select line DSL, the word lines WL0 to WLn, and the source select line SSL of a memory cell block in response to the signals READ, PGM, ERASE, and RADD of the control circuit 120. The voltage supply circuit includes the voltage generator 130 and the row decoder 140.

The voltage generator 130 outputs operating voltages (for example, Vpgm, Vpass, and Vpass) for programming, reading, or erasing memory cells to global lines in response to the operating signals PGM, READ, and ERASE (that is, the internal command signals) of the control circuit 120.

The row decoder 140 transfers the operating voltages of the voltage generator 130 to the strings ST1 to STk of a memory cell block, selected from among the memory cell blocks of the memory cell array 110, in response to the row address signals RADD of the control circuit 120. That is, the operating voltages are supplied to the local lines DSL, WL[n:0], and SSL of the selected memory cell block.

The page buffer group 150 includes page buffers PB1 to PBi coupled to the respective bit lines BL0 to BLk. One bit line may be coupled to one page buffer, or two bit lines may be coupled to one page buffer. The page buffer group 150 supplies voltages for storing data in the memory cells C00 to Ck0 to the bit lines BL0 to BLk in response to the control signals PB SIGNALS of the control circuit 120.

More particularly, the page buffer group 150 precharges the bit lines BL0 to BLk or latches data corresponding to the threshold voltages of the memory cells C00 to Ck0, detected based on a change in the voltages of the bit lines BL0 to BLk, in the program operation, the erase operation, or the read operation of the memory cells C00 to Ck0. That is, the page buffer group 150 controls the voltages of the bit lines BL0 to BLk based on data stored in the memory cells C00 to Ck0 and detects data stored in the memory cells C00 to Ck0.

The column selector 160 selects the page buffers PB0 to PBi of the page buffer group 150 in response to the column address signal CADD of the control circuit 120. Data latched in a page buffer selected by the column selector 160 is outputted.

The I/O circuit 170 transfers external data to the column selector 160 under the control of the control circuit 120 in the program operation so that the external data is inputted to the page buffer group 150. When the column selector 160 sequentially transfers the data to the page buffers PB0 to PBi of the page buffer group 150, the page buffers PB0 to PBi store the received data in their internal latches. Furthermore, in the read operation, the I/O circuit 170 outputs data, received from the page buffers PB0 to PBi of the page buffer group 150, to the outside through the column selector 160.

The pass/fail determination circuit 180 determines whether a memory cell having a threshold voltage lower than a target level exists in programmed memory cells in a program verify operation performed after a program operation and outputs a result of the determination in the form of the pass/fail signal PFS. The pass/fail determination circuit 180 also counts the number of fail bits and outputs the counted number of fail bits in the form of the check signal CS.

Figure 4:
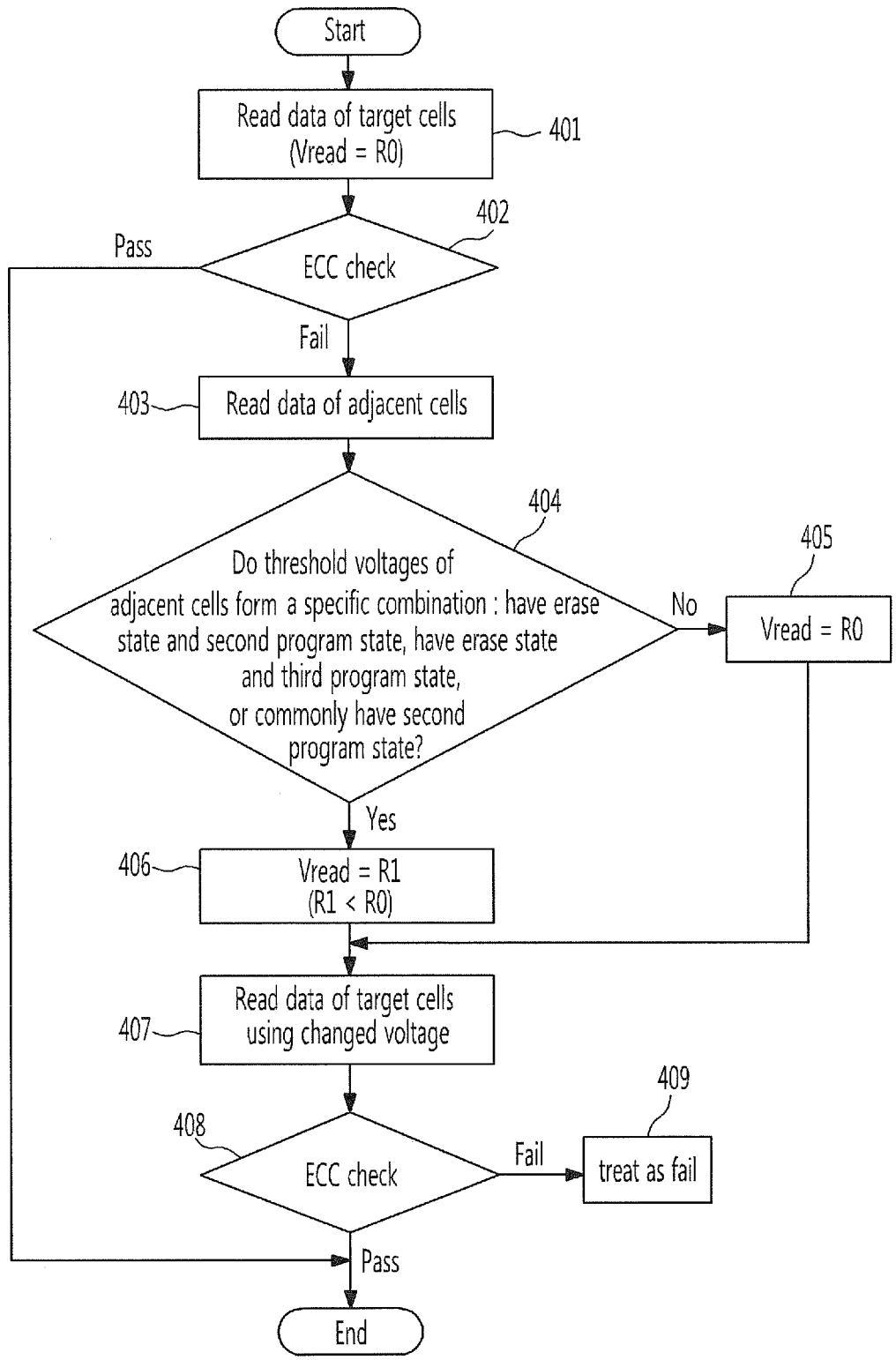
FIG. 4 is a flowchart illustrating a read method according to a first embodiment of this disclosure.

FIG. 4 is a flowchart illustrating a read method according to a first embodiment of this disclosure.

Referring to FIG. 4, the threshold voltages of memory cells may be classified into an erase state, a first program state, a second program state, and a third program state. The erase state refers to a state in which the threshold voltage is lower than a ground voltage 0 V, the first program state refers to a state in which the threshold voltage has the lowest level (e.g., non-erase-state voltage level), and the third program state refers to a state in which the threshold voltage has the highest level. In the following embodiments, three program states are described as an example, but the threshold voltage may have three or more program states. The read operation of the first embodiment is performed as follows.

(Step 401) Read Data of Target Cells

When the read operation is started, the data of target cells to be read is read by using a start read voltage Vread=R0. If memory cells coupled to the same word line are divided into even cells and odd cells, the data of the even cells is first read. Here, the order of reading may be changed.

(Step 402) Check ECC

It is determined whether an error correction operation is feasible (e.g., possible) based on the read data and an error correction code (ECC). If the number of error bits in the read data is smaller than the valid number of fail bits, the error correction operation is determined to be feasible. The error correction operation is determined not to be feasible in other cases. If the error correction operation is determined to be feasible, the read operation is treated as being a pass and then finished.

(Step 403) Read Data of Adjacent Cells

If the error correction operation at step 402 is determined to be a fail, the data of adjacent cells adjacent to the target cells is read. According to an example, the adjacent cells are coupled to the same word line as the target cells but belong to different cell strings from the target cells.

(Step 404) Determine States of Adjacent Cells

The adjacent cells coupled to the same word line as each of the target cells are two cells coupled to the cell strings on both sides of the string of the target cell. It is determined whether two of the adjacent cells for the following combination: have the erase state and the second program state, have the erase state and the third program state, or commonly have the second program state. If the adjacent cells form the above combination, the threshold voltages of the target cells may be down-shifted as compared with other combinations. Such results were confirmed through experiments. Accordingly, the read voltage Vread of the target cells is changed according to the states of the adjacent cells.

(Step 405) Vread=Ro

If, as a result of the determination at step 404, the two adjacent cells do not have the above-described specific combination, the read voltage Vread maintains the start read voltage R0.

(Step 406) Vread=R1

If, as a result of the determination at step 404, the two adjacent cells have the above-described combination, the read voltage Vread of the target cell is changed (that is, lowered). The changed read voltage Vread is hereinafter referred to as R1.

(Step 407) Read Data of Target Cells

The data of the target cells is read using the read voltage Vread changed at step 405 or 406.

(Step 408) Check ECC

It is then determined whether an error correction operation is feasible. If, as a result of the determination, the error correction operation is determined to be feasible (that is, target memory cells pass the test), the read operation of the target cells is finished. If, as a result of the determination, the error correction operation is determined to be unfeasible (e.g., impossible so that the target memory cells fail the test), the read operation of the target cells is treated as being a fail at step 409. That is, a page consisting of the target cells is treated as being a fail page.

Figure 5:
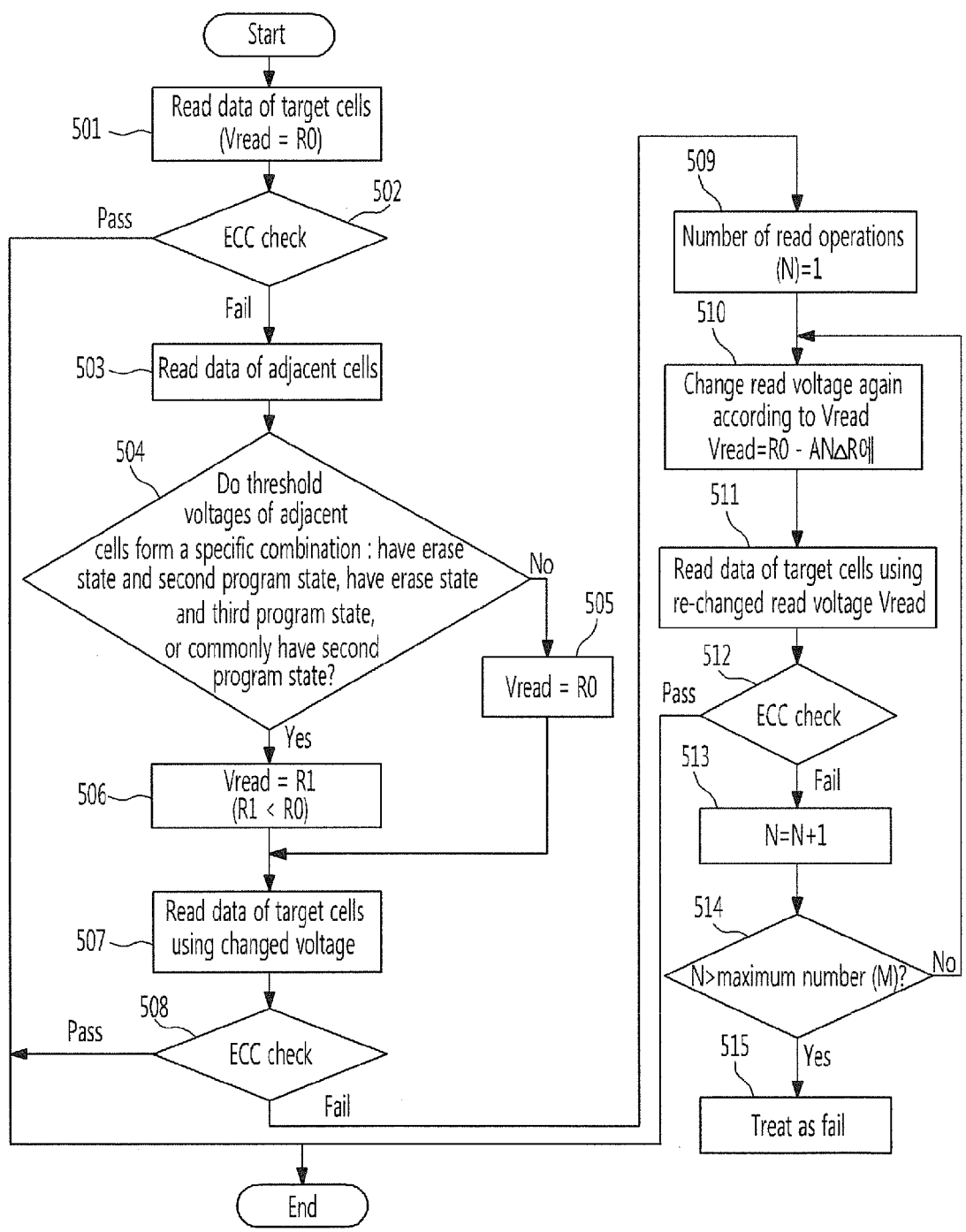
FIG. 5 is a flowchart illustrating a read method according to a second embodiment of this disclosure.

FIG. 5 is a flowchart illustrating a read method according to a second embodiment of this disclosure.

(Step 501) Read Data of Target Cells

When the read operation is started, the data of target cells to be read is read. In the read operation, a start read voltage Vread is R0.

(Step 502) Check ECC

It is determined whether an error correction operation is feasible based on the read data of the target cells and an error correction code. If, as a result of the determination, the error correction operation is determined to be feasible, the read operation of the target cells is finished.

(Step 503) Read Data of Adjacent Cells

If, as a result of the determination at step 502, the error correction operation is determined to be unfeasible, the data of adjacent cells adjacent to the target cells is read. Here, the adjacent cells are coupled to the same word line as the target cells, but belong to different cell strings from the cell strings of the target cells.

(Step 504) Determine States of Adjacent Cells

It is determined whether two of the adjacent cells, form specific combination: have the erase state and the second program state, the erase state and the third program state, or commonly have the second program state. If the adjacent cells the above-described combination, the threshold voltages of the target cells may be down-shifted as compared with other combinations. Such results were confirmed through experiment results. Accordingly, the read voltage Vread of the target cells is changed according to the states of the adjacent cells.

(Step 505) Vread=Ro

If, as a result of the determination at step 504, the two adjacent cells do not have the above-described combination, the read voltage Vread maintains the start read voltage R0.

(Step 506) Vread=R1

If, as a result of the determination at step 504, the two adjacent cells have the above-described combination, the read voltage Vread of the target cell is changed (that is, lowered). The changed read voltage Vread is hereinafter referred to as R1.

(Step 507) Read Data of Target Cells

The data of the target cells is read using the read voltage Vread from step 505 or 506.

(Step 508) Check ECC

Next, it is determined whether an error correction operation is feasible. If, as a result of the determination, the error correction operation is determined to be feasible ("pass"), the read operation of the target cells is finished.

(Step 509) Count the Number of Read Operations

If, as a result of the determination at step 508, the error correction operation is determined to be unfeasible ("fail"), the number of read operations N is set to 1 in order to count the number of read operations on the target cells.

(Step 510) Change Read Voltage Again

The read voltage Vread is changed again based on the start read voltage R0, the number of read operations N, and a constant A.

A method of changing the read voltage Vread is described in detail below.

The read voltage Vread may be changed again according to Equation 1 below.

$$Vread = R0 - (A N \Delta R) \quad \text{[Equation 1]}$$

In Equation 1, R0 is the start read voltage, A is the constant, N is the number of read operations, and ΔR is a read voltage variation (e.g., a difference in read voltages, R0-R1). For example, if the start read voltage R0 is 1.5 V, the constant A is 0.5, the number of read operations N is 1, and a read voltage variation ΔR is 0.2 V, a re-changed read voltage Vread is 1.4 V. Here, the constant is an integer greater than 0 and may be changed.

(Step 511) Read Data of Target Cells

The data of the target cells is read again using the re-changed read voltage Vread.

(Step 512) Check ECC

It is determined whether an error correction operation is feasible based on the read data and an error correction code (ECC). If, as a result of the determination, the error correction operation is determined to be feasible (pass), the read operation of the target cells is finished.

(Step 513) Increase the Number of Read Operations

If, as a result of the determination at step 512, the error correction operation is determined to be unfeasible (fail), the number of read operations N is increased. That is, 1 is added to the number of read operations N.

(Step 514) Determine the Number of Read Operations

It is determined whether the increased number of read operations N has reached the maximum number of read operations M. If, as a result of the determination, the number of read operations N is not greater than the maximum number of read operations M, the process returns to step 510. As described above, the read operation is repeatedly performed until the number of read operations N reaches the maximum number of read operations M. If, as a result of the determination at step 514, the number of read operations N reaches the maximum number of read operations M, the read operation of the target cells is treated as being a fail at step 515.

Figure 6:
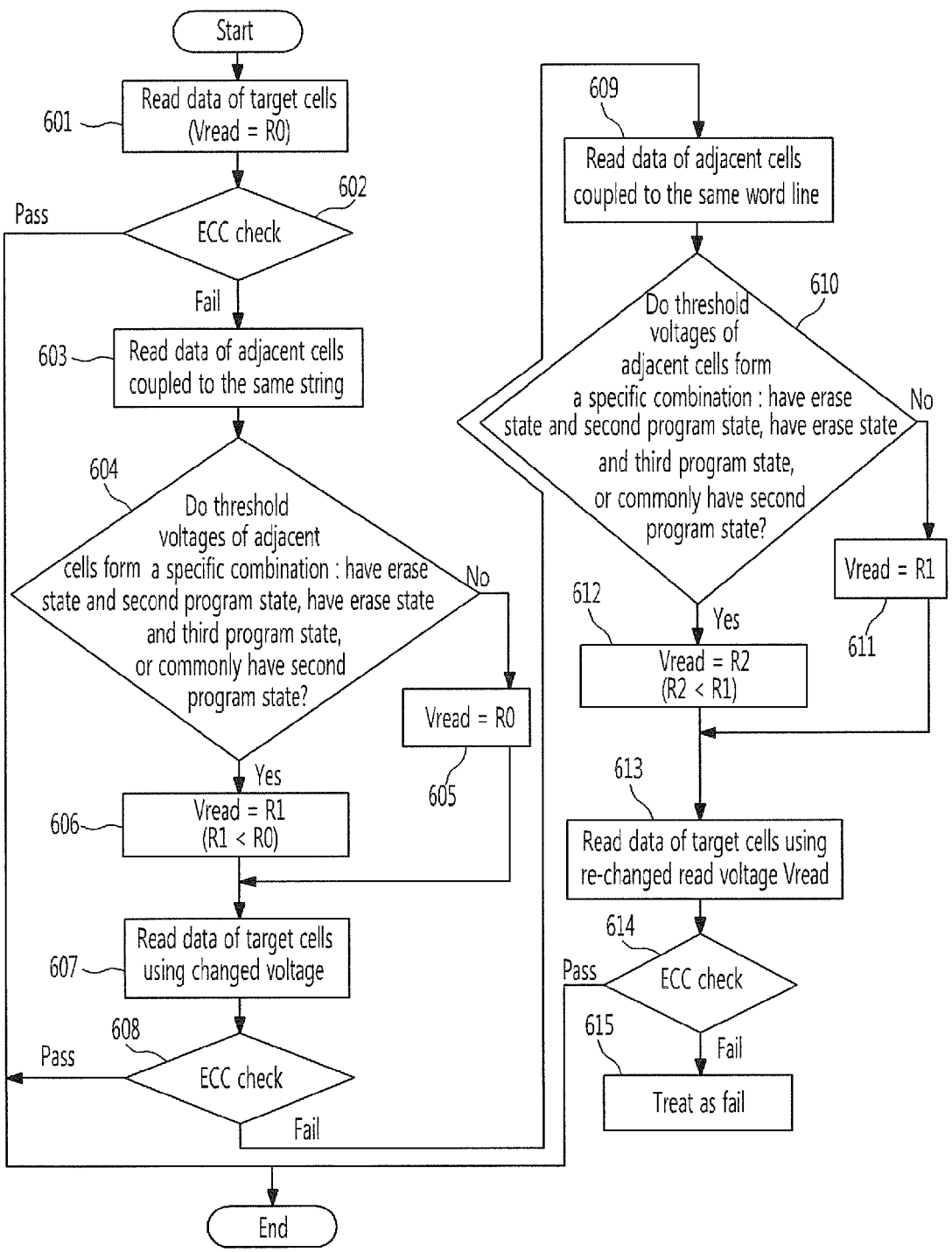
FIG. 6 is a flowchart illustrating a read method according to a third embodiment of this disclosure.

FIG. 6 is a flowchart illustrating a read method according to a third embodiment of this disclosure.

(Step 601) Read Data of Target Cells

When the read operation is started, the data of target cells to be read is read. In the read operation, a start read voltage Vread is R0.

(Step 602) Check ECC

It is determined whether an error correction operation is feasible based on the read data of the target cells and an error correction code. If, as a result of the determination, the error correction operation is determined to be feasible, the read operation of the target cells is finished.

(Step 603) Read data of adjacent cells

If, as a result of the determination at step 602, the error correction operation is determined to be unfeasible, the data of two adjacent cells belonging to the same string as the target cells, from among adjacent cells adjacent to the target cells, is read.

(Step 604) Determine states of adjacent cells

The states of the adjacent cells are determined based on the read data of the adjacent cells. More particularly, it is determined whether the two adjacent cells, form a specific combination: have the erase state and the second program state, the erase state and the third program state, or commonly have the second program state. If the adjacent cells have the above-described combination, the threshold voltages of the target cells may be down-shifted as compared with other combinations. Such results were confirmed through experiments. Accordingly, the read voltage Vread of the target cells is changed according to the states of the adjacent cells.

(Step 605) Vread=Ro

If, as a result of the determination at step 604, the two adjacent cells form the above combination, the read voltage Vread maintains the start read voltage R0.

(Step 606) Vread=R1

If, as a result of the determination at step 604, the two adjacent cells forming a combination described above, the read voltage Vread of the target cells is lowered (that is, changed) to R1.

(Step 607) Read Data of Target Cells

The data of the target cells is read using the read voltage Vread changed at step 605 or 606.

(Step 608) Check ECC

Next, it is determined whether an error correction operation is feasible. If, as a result of the determination, the error correction operation is determined to be feasible (pass), the read operation of the target cells is finished.

(Step 609) Read Data of Adjacent Cells

The data of two adjacent cells coupled to the same word line as the target cell, from among the adjacent cells adjacent to the target cells, is read.

(Step 610) Determine States of Adjacent Cells

The states of the adjacent cells are determined based on the read data of the adjacent cells. More particularly, it is determined whether the two adjacent cells, form a combination described above: have the erase state and the second program state, have the erase state and the third program state, or commonly have the second program state based on the data of the adjacent cells. If the adjacent cells have the above-described combination, the threshold voltages of the target cells may be down-shifted as compared with other combinations. Such results were confirmed through experiments. Accordingly, the read voltage Vread of the target cells is changed according to the states of the adjacent cells.

(Step 611) Vread=Ro

If, as a result of the determination at step 610, the two adjacent cells form a combination described above, the read voltage Vread maintains the previous read voltage R1.

(Step 612) Vread=R1

If, as a result of the determination at step 610, the two adjacent cells form a combination described above, the read voltage Vread of the target cells is lowered (that is, changed) to a second read voltage R2.

(Step 613) Read Data of Target Cells

The data of the target cells is read using the read voltage Vread changed again at step 611 or 612.

(Step 614) Check ECC

Next, it is determined whether an error correction operation is feasible. If, as a result of the determination, the error correction operation is determined to be feasible (pass), the read operation of the target cells is finished/terminated. If, as a result of the determination, the error correction operation is determined to be unfeasible (fail), the read operation of the target cells is treated as being a fail at step 615.

Figure 7A:
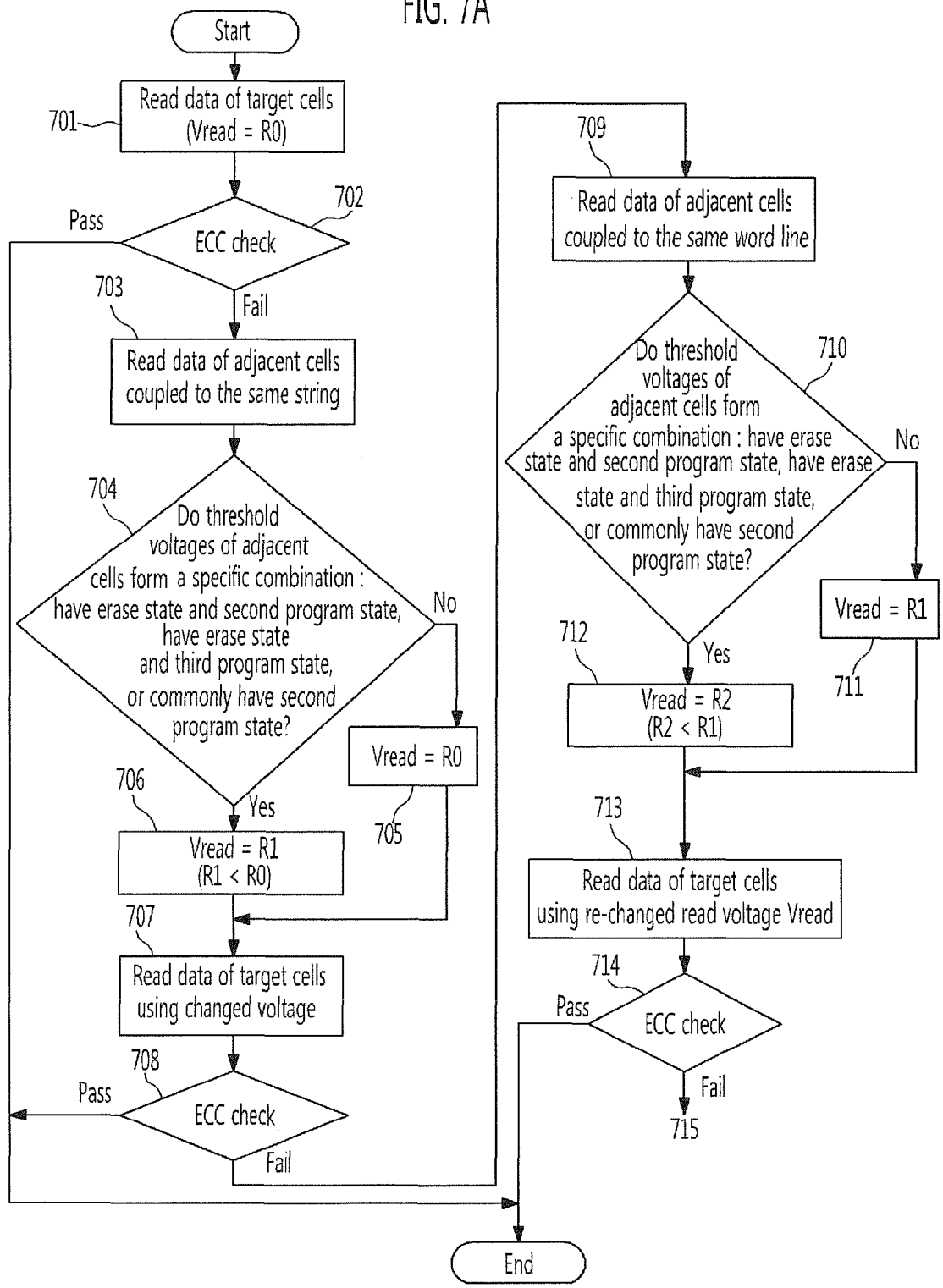

FIGS. 7A and 7B are flowcharts illustrating a read method according to a fourth embodiment of this disclosure. The read operation is described with reference to FIG. 7A.

(Step 701) Read Data of Target Cells

When the read operation is started, the data of target cells to be read is read. In the read operation, a start read voltage Vread is R0.

(Step 702) Check ECC

It is determined whether an error correction operation is feasible based on the read data of the target cells and an error correction code. If, as a result of the determination, the error correction operation is determined to be feasible, the read operation of the target cells is finished.

(Step 703) Read Data of Adjacent Cells

If, as a result of the determination at step 702, the error correction operation is determined to be unfeasible, the data of two adjacent cells belonging to the same string as the target cells, from among adjacent cells adjacent to the target cells, is read.

(Step 704) Determine States of Adjacent Cells

The states of the adjacent cells are determined based on the read data of the adjacent cells. More particularly, it is determined whether the two adjacent cells form a specific combination: have the erase state and the second program state, have the erase state and the third program state, or commonly have the second program state. If the adjacent cells have the above-described combination, the threshold voltages of the target cells may be down-shifted as compared with other combinations. Such results were confirmed through experiments. Accordingly, the read voltage Vread of the target cells is changed according to the states of the adjacent cells.

(Step 705) Vread=Ro

If, as a result of the determination at step 704, the two adjacent cells form a combination described above, the read voltage Vread maintains the start read voltage R0.

(Step 706) Vread=R1

If, as a result of the determination at step 704, the two adjacent cells form a combination described above, the read voltage Vread of the target cells is lowered (that is, changed) to R1.

(Step 707) Read Data of Target Cells

The data of the target cells is read using the read voltage Vread changed at step 705 or 706.

(Step 708) Check ECC

Next, it is determined whether an error correction operation is feasible. If, as a result of the determination, the error correction operation is determined to be feasible (pass), the read operation of the target cells is finished.

(Step 709) Read Data of Adjacent Cells

The data of two adjacent cells coupled to the same word line as the target cell, from among the adjacent cells adjacent to the target cells, is read.

(Step 710) Determine States of Adjacent Cells

The states of the adjacent cells are determined based on the read data of the adjacent cells. More particularly, it is determined whether the two adjacent cells form a specific combination: have the erase state and the second program state, have the erase state and the third program state, or commonly have the second program state. If the adjacent cells have the above-described combination, the threshold voltages of the target cells may be down-shifted as compared with other combinations. Such results were confirmed through experiments. Accordingly, the read voltage Vread of the target cells is changed according to the states of the adjacent cells.

(Step 711) Vread=Ro

If, as a result of the determination at step 710, the two adjacent cells form a combination described above, the read voltage Vread maintains the previous read voltage R1.

(Step 712) Vread=R2

If, as a result of the determination at step 710, the two adjacent cells form a combination described above, the read voltage Vread of the target cells is lowered (that is, changed) to a second read voltage R2.

(Step 713) Read data of target cells

The data of the target cells is read using the read voltage Vread changed again at step 711 or 712.

(Step 714) Check ECC

Next, it is determined whether an error correction operation is feasible. If, as a result of the determination, the error correction operation is determined to be feasible (pass), the read operation of the target cells is finished.

The read operation is described with reference to FIG. 7B.

(Step 715) Increase the Number of Read Operations

If, as a result of the determination at step 714, the error correction operation is determined to be unfeasible (fail), the number of read operations N is set to 1 in order to count the number of read operations on the target cells.

(Step 716) Change Read Voltage Again

The read voltage Vread is changed again based on the start read voltage R0, the number of read operations N, and a constant A. The read voltage Vread is changed again according to Equation 1 described in FIG. 5.

(Step 717) Read Data of Target Cells

The data of the target cells is read again using the re-changed read voltage Vread.

(Step 718) Check ECC

It is determined whether an error correction operation is feasible (e.g., possible) based on the read data and an error correction code (ECC). If, as a result of the determination, the error correction operation is determined to be feasible (pass), the read operation of the target cells is finished.

(Step 719) Increase the Number of Read Operations

If, as a result of the determination at step 718, the error correction operation is determined to be unfeasible (fail), the number of read operations N is increased. That is, 1 is added to the number of read operations N.

(Step 720) Determine the Number of Read Operations

It is determined whether the increased number of read operations N has reached the maximum number of read operations M. If, as a result of the determination, the number of read operations N is not greater than the maximum number of read operations M, the process returns to step 716. As described above, the read operation is repeatedly performed until the number of read operations N reaches the maximum number of read operations M. If, as a result of the determination at step 720, the number of read operations N reaches the maximum number of read operations M, the read operation of the target cells is treated as being a fail at step 721.

Figure 8:
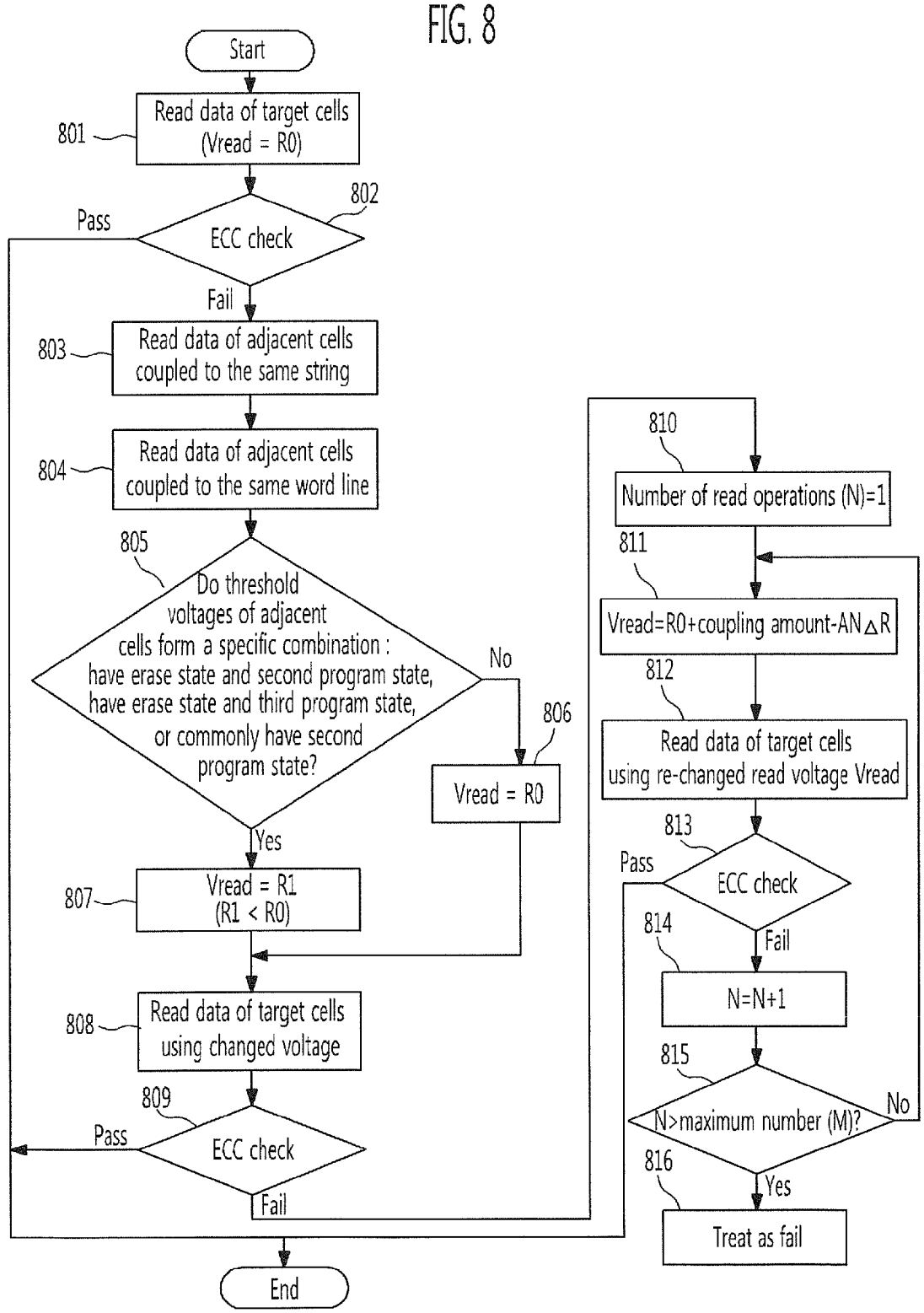
FIG. 8 is a flowchart illustrating a read method according to a fifth embodiment of this disclosure.

FIG. 8 is a flowchart illustrating a read method according to a fifth embodiment of this disclosure.

(Step 801) Read Data of Target Cells

When the read operation is started, the data of target cells to be read is read. In the read operation, a start read voltage Vread is R0.

(Step 802) Check ECC

It is determined whether an error correction operation is feasible based on the read data of the target cells and an error correction code. If, as a result of the determination, the error correction operation is determined to be feasible, the read operation of the target cells is finished.

(Step 803) Read Data of Adjacent Cells

If, as a result of the determination at step 802, the error correction operation is determined to be unfeasible, the data of adjacent cells adjacent to the target cells is read. Here, the adjacent cells are two adjacent cells coupled to the same string as the target cells.

(Step 804) Read Data of Adjacent Cells

The data of two adjacent cells coupled to the same word line, from among the adjacent cells adjacent to the target cells, is read.

(Step 805) Determine States of Adjacent Cells

It is determined whether two of the adjacent cells form a specific combination: have the erase state and the second program state, have the erase state and the third program state, or commonly have the second program state based on the read data of the adjacent cells. If the adjacent cells have the above-described combination, the threshold voltages of the target cells may be down-shifted as compared with other combinations. Such results were confirmed through experiments. Accordingly, the read voltage Vread of the target cells is changed according to the states of the adjacent cells.

(Step 806) Vread=Ro

If, as a result of the determination at step 805, the two adjacent cells form a combination described above, the read voltage Vread maintains the start read voltage R0.

(Step 807) Vread=R1

If, as a result of the determination at step 804, the two adjacent cells form a combination described above, the read voltage Vread of the target cells is lowered (that is, changed). The lowered read voltage is referred to as R1.

(Step 808) Read Data of Target Cells

The data of the target cells is read using the read voltage Vread changed at step 806 or 807.

(Step 809) Check ECC

Next, it is determined whether an error correction operation is feasible. If, as a result of the determination, the error correction operation is determined to be feasible (pass), the read operation of the target cells is finished.

(Step 810) Count the Number of Read Operations

If, as a result of the determination at step 809, the error correction operation is determined to be unfeasible (fail), the number of read operations N is set to 1 in order to count the number of read operations on the target cells.

(Step 811) Change Read Voltage Again

The read voltage Vread is changed again based on the start read voltage R0, the number of read operations N, and a constant A.

A method of changing the read voltage Vread again is described in detail below.

The read voltage Vread may be changed again according to Equation 2 below.

$$V\text{read} = R0 + \text{Couping amount} - A N \Delta R \quad \text{[Equation 2]}$$

In Equation 2, R0 is the start read voltage, A is a constant, N is the number of read operations, and ΔR is a read voltage variation (e.g., a difference in read voltages, R0-R1) caused by adjacent cells (that is, adjacent cells in the direction of the same string and word line). The coupling amount ("coupling amount") is varied by the data of two adjacent cells in the same string as the target cells and the data of two adjacent cells coupled to the same word line as the target cell. According to experiments, if the data of two adjacent cells in the same string as a target memory cell was 01, a change of read voltage was 400 mV. If the data of two adjacent cells coupled to the same string was 00, a change of voltage was 100 mV. In another example, if the data of two adjacent cells coupled to the same string was 10, a change of voltage was 300 mV. On the other hand, if the data of two adjacent cells coupled to the same word line was 01, a change of voltage was 320 mV. If the data of two adjacent cells coupled to the same word line was 00, a change of voltage was 80 mV. If the data of two adjacent cells coupled to the same word line was 10, a change of read voltage was 240 mV. According to the states of adjacent cells, voltage changed. The decreases in the read voltages as obtained through experiments are as follows. If the data of two adjacent cells coupled to the same string was 11, the change of the read voltage was 300 mV. If the data of two adjacent cells coupled to the same string was 01, the decrease of the read voltage was 200 mV. If the data of two adjacent cells coupled to the same string was 00, the decrease of read voltage was 100 mV. If the data of two adjacent cells coupled to the same string was 10, the decrease of the read voltage was not changed. Furthermore, if the data of two adjacent cells coupled to the same word line was 11, the decrease of the data retention characteristic was 450 mV. If the data of two adjacent cells coupled to the same word line was 01, the decrease of the read voltage was 300 mV. If the data of two adjacent cells coupled to the same word line was 00, the decrease of the read voltage was 150 mV. If the data of two adjacent cells coupled to the same word line was 10, the read voltage was not changed. Values obtained, for example, as described above may be applied as "the coupling amount" of Equation 2.

(Step 812) Read Data of Target Cells

The data of the target cells is read again using the re-changed read voltage Vread.

(Step 813) Check ECC

It is determined whether an error correction operation is feasible based on the read data and an error correction code (ECC). If, as a result of the determination, the error correction operation is determined to be feasible (pass), the read operation of the target cells is finished.

(Step 814) Increase the Number of Read Operations

If, as a result of the determination at step 813, the error correction operation is determined to be unfeasible (fail), the number of read operations N is increased. That is, 1 is added to the number of read operations N.

(Step 815) Determine the Number of Read Operations

It is determined whether the increased number of read operations N has reached the maximum number of read operations M. If, as a result of the determination, the number of read operations N is not greater than the maximum number of read operations M, the process returns to step 811. As described above, the read operation is repeatedly performed until the number of read operations N reaches the maximum number of read operations M. If, as a result of the determination at step 815, the number of read operations N reaches the maximum number of read operations M, the read operation of the target cells is treated as being a fail at step 816.

As described above, according to this disclosure, when the data of target cells is read, the read voltage of the target cells is changed based on a result of the read operation of cells adjacent to the target cells. Although the threshold voltages of the target cells are changed in a program operation on adjacent cells, the data of the target cells can be read still within the maximum number of read operations. Accordingly, reliability of the read operation can be improved.

Furthermore, when the read operation of target cells is performed, the read voltage of the target cells is changed depending on a result of the read operation of cells adjacent to the target cells and the read operation of the target cells is performed using the changed read voltage. Accordingly, reliability of the read operation can be increased.

What is claimed is:

1. A read method of a semiconductor memory device, comprising:
    performing a first read operation on target cells by using a first read voltage;
    performing a first error correction operation based on read data of the first read operation;
    determining whether the first error correction operation is feasible or unfeasible;
    terminating the first read operation on the target cells when the first error correction is feasible;
    performing a second read operation on first cells adjacent to the target cells along a first direction by using voltages to classify the first cells into an erase state, a first program state, a second program state or a third program state when the first error correction is unfeasible;
    setting the first read voltage to a second read voltage according to a combination of the first cells as a result of the second read operation;
    performing a third read operation on the target cells by using the second read voltage;
    performing a second error correction operation based on read data of the third read operation;
    determining whether the second error correction operation is feasible or unfeasible;
    terminating the third read operation on the target cells when the second error correction is feasible; and
    treating the target cells as a fail cell when the second error correction is unfeasible.

2. The read method of claim 1, wherein the first cells include cells coupled to a same word line as the target cells.

3. The read method of claim 1, wherein when, as a result of the second read operation on the first cells, the combination of the first cells has the erase state and the second program state higher than the erase state, has the erase state and the third program state higher than the second program state, or commonly has the second program state, the second read voltage is set lower than the first read voltage.

4. The read method of claim 1, wherein when, as a result of performing the second read operation on the first cells, the combination of the first cells does not have the erase state and the second program state higher than the erase state, have the erase state and the third program state higher than the second program state, or commonly have the second program state, the second read voltage is set the same as the first read voltage.

5. The read method of claim 1, further comprising determining the third read operation of the target cells to be a fail or setting the second read voltage to a third read voltage, and performing a fourth read operation on the target cells by using the third read voltage, when the second error correction is unfeasible.

6. The read method of claim 5, wherein the setting the second read voltage to the third read voltage, and performing the fourth read operation on the target cells by using the third read voltage comprises:
   counting a number of times a read operation is performed on the target cells;
   setting the second read voltage to the third read voltage in response to the count;
   performing the fourth read operation on the target cells by using the third read voltage;
   performing a third error correction operation based on read data of the fourth read operation;
   determining whether the third error correction operation is feasible or unfeasible; terminating the fourth read operation of the target cells when the third error correction is feasible; and
   treating the target cells as a fail cell when the third error correction is unfeasible.

7. The read method of claim 6, wherein the third read voltage is determined as a voltage obtained by subtracting a value, calculated by multiplying the counted number of read operations performed on the target cells, a constant, and a read voltage variation, from a previous read voltage.

8. The read method of claim 6, further comprising setting the third read voltage to a fourth read voltage while gradually increasing the counted number and performing a fifth read operation on the target cells by using the fourth read voltage, when the third error correction is unfeasible.

9. The read method of claim 8, wherein when the counted number of times the third read operation is performed reaches a maximum number, the third read operation is determined to be a fail.

10. The read method of claim 1, further comprising the steps of
   performing a sixth read operation on second cells adjacent to the target cells along a second direction different from the first direction when the first error correction is unfeasible;
   setting the first read voltage to a fifth read voltage according to a result of the sixth read operation on the second cells;
   performing a seventh read operation on the target cells by using the fifth read voltage.

11. The read method of claim 10, wherein:
   the first cells are coupled to a same string as the target cells, and the second cells are coupled to a same word line as the target cells.

12. The read method of claim 10, wherein when, as a result of the seventh read operation, threshold voltages of the second cells adjacent to the target cells have the erase state and the second program state higher than the erase state, the erase state and the third program state higher than the second program state, or commonly have the second program state, the fifth read voltage is set lower than the first read voltage.

13. The read method of claim 10, wherein when, as a result of performing the sixth read operation, threshold voltages of the second cells do not have the erase state and the second program state higher than the erase state, the erase state and the third program state higher than the second program state, or commonly have the second program state, the fifth read voltage is set the same as the first read voltage.

14. The read method of claim 10, wherein when, as a result of performing the seventh read operation, an error correction is unfeasible, the seventh read operation is determined to be as a fail or the fifth read voltage is set again and the target cells are read by using the set fifth read voltage.

15. The read method of claim 10, wherein the performing of the seventh read operation comprises:
   counting a number of times a read operation performed on the target cells;
   setting the fifth read voltage to a sixth read voltage lower than the fifth read voltage; and
   terminating the sixth read operation when an error correction of the seventh read operation is feasible.

16. The read method of claim 15, wherein the sixth read voltage is determined as a voltage obtained by subtracting a value, calculated by multiplying the counted number of read operation performed on the target cells, a constant, and a read voltage variation, from a previous read voltage.

17. The read method of claim 15, further comprising setting the sixth read voltage to a seventh read voltage while gradually increasing the counted number and performing an eighth read operation on the target cells by using the seventh read voltage, when the error correction of the seventh read operation is unfeasible.

18. The read method of claim 17, wherein when the counted number of the eighth read operation is performed reaches a maximum number, the eighth read operation is determined to be a fail.

19. A read method of a semiconductor memory device, comprising:
   performing a read operation on target cells by using a first read voltage;
   performing a read operation on cells adjacent to the target cells along a first direction by using voltages to classify the cells into an erase state. a first program state, a second program state or a third program state when, as a result of the read operation on the target cells, error correction is unfeasible;
   selecting one of a plurality of read voltages according to a combination of the cells as a result of the read operation on the cells adjacent to the target cells;
   performing a read operation on the target cells by using the selected read voltages;
   counting a number of times that the read operation is performed on the target cells when, as a result of performing the read operation on the target cells using the selected read voltage, error correction is unfeasible; and
   performing the read operation on the target cells by changing the selected read voltage in response to the count.

20. The read method of claim 19, wherein the cells adjacent to the target cells comprise first cells coupled to a same string as the target cells and second cells coupled to a same word line as the target cells.

21. The read method of claim 19, wherein in performing the read operation using the selected read voltage, when the combination of the cells has the erase state and the second program state higher than the erase state, has the erase state and the third program state higher than the second program state, or commonly has the second program state, the target cells are read using a second read voltage.

22. The read method of claim 19, wherein in performing the read operation using the selected read voltage, when the combination of the cells does not have the erase state and the second program state higher than the erase state, have the erase state and the third program state higher than the second program state, or commonly have the second program state, the target cells are read using the first read voltage.

23. The read method of claim 19, wherein the selected read voltage is determined as voltage obtained by adding a value corresponding to a capacitive coupling between the target cells and the cells adjacent to the target cells to the first read voltage and subtracting a value, calculated by multiplying the counted number of read operation of the target cells, a constant, and a read voltage variation, from the added result.

24. The read method of claim 19, further comprising:
terminating the read operation of the target cells when, as a result of performing the read operation on the target cells using the selected read voltage, the error correction is feasible; and
changing the selected read voltage while gradually increasing the counted number and performing the read operation on the target cells by using the selected read voltage, when, as a result of performing the read operation on the target cells using the selected read voltage, the error correction is unfeasible.

25. The read method of claim 24, wherein when the counted number reaches a maximum number, the read operation of the target cells is determined to be a fail.

26. A read method of a semiconductor memory device, comprising:
performing a first read operation on target cells by using a first read voltage;
performing a first error correction operation based on read data of the first read operation;
determining whether the first error correction operation is feasible or unfeasible;
terminating the first read operation on the target cells when the first error correction is feasible;
performing a second read operation on first cells adjacent to the target cells in a first direction by using voltages to classify the first cells into an erase state, a first program state, a second program state or a third program state when the first error correction is unfeasible;
setting the first read voltage to a second read voltage according to a combination of the first cells as a result of the second read operation; and
performing a third read operation on the target cells by using the second read voltage.

* * * * *